United States Patent
Lemaitre

(10) Patent No.: US 9,711,321 B2
(45) Date of Patent: Jul. 18, 2017

(54) LOW ABERRATION, HIGH INTENSITY ELECTRON BEAM FOR X-RAY TUBES

(71) Applicant: General Electric Company, Schenectady, NY (US)

(72) Inventor: Sergio Lemaitre, Milwaukee, WI (US)

(73) Assignee: General Electric Company, Schenectady, NY (US)

(*) Notice: Subject to any disclaimer, the term of this patent is extended or adjusted under 35 U.S.C. 154(b) by 160 days.

(21) Appl. No.: 14/586,066

(22) Filed: Dec. 30, 2014

(65) Prior Publication Data

US 2016/0189908 A1 Jun. 30, 2016

(51) Int. Cl.
*H01J 35/06* (2006.01)
*H01J 37/063* (2006.01)
(Continued)

(52) U.S. Cl.
CPC .......... *H01J 35/06* (2013.01); *H01J 37/063* (2013.01); *H01J 3/38* (2013.01); *H01J 19/10* (2013.01);
(Continued)

(58) Field of Classification Search
CPC ..... A61B 6/00; A61B 6/40; A61B 6/44; H01J 3/00; H01J 3/02; H01J 3/027; H01J 3/06; H01J 3/14; H01J 3/18; H01J 3/38; H01J 9/00; H01J 9/02; H01J 9/04; H01J 19/00; H01J 19/02; H01J 19/04; H01J 19/08; H01J 19/10; H01J 19/12; H01J 19/28; H01J 19/38; H01J 19/42; H01J 19/46; H01J 19/48; H01J 23/00; H01J 23/02; H01J 23/04; H01J 23/06; H01J 23/08; H01J 23/083; H01J 29/00; H01J 29/02; H01J 29/025; H01J 29/04; H01J 29/46; H01J 29/48; H01J 29/485; H01J 29/488; H01J 29/50; H01J 29/51; H01J 29/58; H01J 29/62; H01J 29/622; H01J 29/624; H01J 33/00; H01J 33/02; H01J 33/04; H01J 33/06; H01J 33/063; H01J 33/065;
(Continued)

(56) References Cited

U.S. PATENT DOCUMENTS 4,344,011 A * 8/1982 Hayashi .................. H01J 35/06
313/453
7,795,792 B2 9/2010 Arnold et al.
(Continued)

OTHER PUBLICATIONS

Anonymous, "Rectilinear, adj. and n.: Oxford English Dictionary", pp. 1-2, Jan. 1, 2016.
(Continued)

*Primary Examiner* — Anastasia Midkiff
(74) *Attorney, Agent, or Firm* — Boyle Fredrickson, S.C.

(57) ABSTRACT

In the present invention, a cathode for an x-ray tube is formed with a large area flat emitter. To reduce aberrations to a minimum the emission area in the flat emitter has a non-rectangular shape and focusing pads arranged around the emitter. In an exemplary embodiment, the flat emitter has a non-rectangular polygonal shape for an emission area on the emitter in order to increase the emission current from the emitter at standard voltage levels without the need to run the emitters at a higher temperature, add additional emitters to the cathode and/or to coat the emitters with a low work function material.

19 Claims, 6 Drawing Sheets

(51) Int. Cl.
*H01J 19/10* (2006.01)
*H01J 3/38* (2006.01)
*H01J 19/48* (2006.01)

(52) U.S. Cl.
CPC ....... *H01J 19/48* (2013.01); *H01J 2229/4844* (2013.01); *H01J 2229/4896* (2013.01); *H01J 2235/06* (2013.01)

(58) Field of Classification Search
CPC ............... H01J 2201/00; H01J 2201/19; H01J 2203/00; H01J 2203/02; H01J 2217/00; H01J 2217/04; H01J 2217/06; H01J 2217/062; H01J 2217/12; H01J 2223/00; H01J 2223/02; H01J 2223/04; H01J 2223/06; H01J 2223/08; H01J 2223/083; H01J 2235/00; H01J 2235/06; H01J 2235/068; H01J 2229/00; H01J 2229/48; H01J 2229/4803; H01J 2229/481; H01J 2229/4824; H01J 2229/4827; H01J 2229/4831; H01J 2229/4844; H01J 2229/4858; H01J 2229/4865; H01J 2229/50; H01J 2229/58; H01J 2229/582; H01J 2229/583; H01J 2229/5835; H01J 2237/00; H01J 2237/03; H01J 2237/032; H01J 2237/04; H01J 2237/049; H01J 2237/06; H01J 2237/063; H01J 2237/06308; H01J 2237/06375; H01J 2893/00; H01J 2893/0001; H01J 2893/0002; H01J 2893/0005; H01J 2893/0011; H01J 2893/0012; H01J 2893/0015; H01J 2893/0029; H01J 2893/0048; H01J 2893/0049; H01J 2893/005; H01J 2893/0088; H01J 2893/0089; H01J 2893/0094; H01J 35/06; H01J 37/063; H01J 2229/4896
See application file for complete search history.

(56) References Cited

U.S. PATENT DOCUMENTS

| | | | |
|---|---|---|---|
| 8,077,829 B2* | 12/2011 | Moore | H01J 1/20 378/136 |
| 8,385,506 B2* | 2/2013 | Lemaitre | H01J 1/20 378/136 |
| 8,831,178 B2 | 9/2014 | Lemaitre | |
| 2010/0195797 A1 | 8/2010 | Hauttmann | |
| 2010/0239828 A1 | 9/2010 | Cornaby et al. | |
| 2011/0255667 A1* | 10/2011 | Lemaitre | H01J 35/06 378/113 |
| 2014/0079187 A1 | 3/2014 | Zhang et al. | |

OTHER PUBLICATIONS

International Invitation to Pay Additional Fees issued in connection with corresponding PCT Application No. PCT/US2015/061626 dated Feb. 16, 2016.

\* cited by examiner

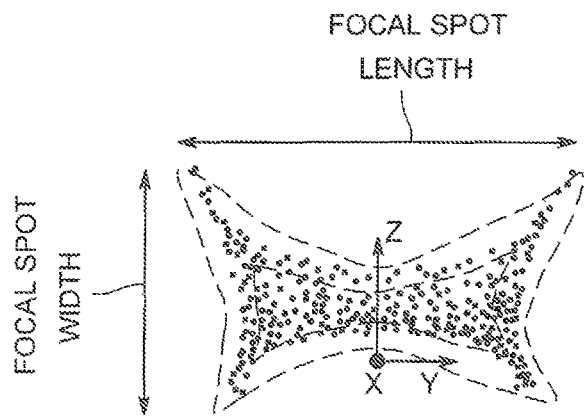
FIG. 1
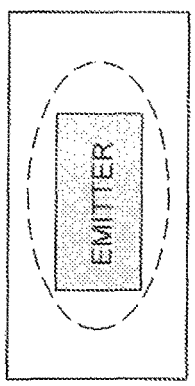 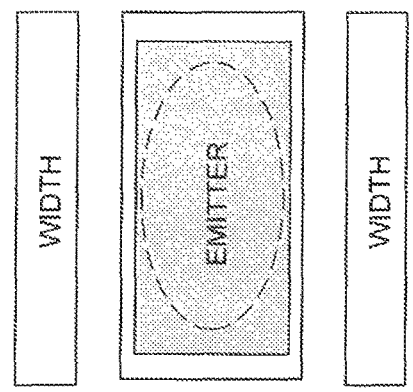
FIG. 2
(PRIOR ART)
FIG. 3
(PRIOR ART)

LOW ABERRATION, HIGH INTENSITY ELECTRON BEAM FOR X-RAY TUBES

BACKGROUND OF INVENTION

The subject matter disclosed herein relates to X-ray tubes, and in particular, to X-ray cathode systems and X-ray cathodes.

Presently available medical x-ray tubes typically include a cathode assembly having an emitter and a cup. The cathode assembly is oriented to face an x-ray tube anode, or target, which is typically a planar metal or composite structure. The space between the cathode and anode is evacuated.

X-ray tubes typically include an electron source, such as a cathode, that releases electrons at high acceleration. Some of the released electrons may impact a target anode. The collision of the electrons with the target anode produces X-rays, which may be used in a variety of medical devices such as computed tomography (CT) imaging systems, X-ray scanners, and so forth. In thermionic cathode systems, a filament is included that may be induced to release electrons through the thermionic effect, i.e. in response to being heated. However, the distance between the cathode and the anode must be kept short so as to allow for proper electron bombardment. Further, thermionic X-ray cathodes typically emit electrons throughout the entirety of the surface of the filament. Accordingly, it is very difficult to focus all electrons into a small focal spot.

X-ray systems typically include an x-ray tube, a detector, and a support structure for the x-ray tube and the detector. In operation, an imaging table, on which an object is positioned, is located between the x-ray tube and the detector. The x-ray tube typically emits radiation, such as x-rays, toward the object. The radiation typically passes through the object on the imaging table and impinges on the detector. As radiation passes through the object, internal structures of the object cause spatial variances in the radiation received at the detector. The data acquisition system then reads the signals received in the detector, and the system then translates the radiation variances into an image, which may be used to evaluate the internal structure of the object. One skilled in the art will recognize that the object may include, but is not limited to, a patient in a medical imaging procedure and an inanimate object as in, for instance, a package in an x-ray scanner or computed tomography (CT) package scanner.

X-ray tubes typically include a rotating anode structure for the purpose of distributing the heat generated at a focal spot. An x-ray tube cathode provides an electron beam from an emitter that is accelerated using a high voltage applied across a cathode-to-anode vacuum gap to produce x-rays upon impact with the anode. The area where the electron beam impacts the anode is often referred to as the focal spot. Typically, the cathode includes one or more cylindrically wound filaments positioned within a cup for emitting electrons as a beam to create a high-power large focal spot or a high-resolution small focal spot, as examples. Imaging applications may be designed that include selecting either a small or a large focal spot having a particular shape, depending on the application.

Conventional cylindrically wound filaments, however, emit electrons in a complex pattern that is highly dependent on the circumferential position from which they emit toward the anode. Due to the complex electron emission pattern from a cylindrical filament, focal spots resulting therefrom can have non-uniform profiles that are highly sensitive to the placement of the filament within the cup. As such, cylindrically wound filament-based cathodes are manufactured having their filament positioned with very tight tolerances in order to meet the exacting focal spot requirements in an x-ray tube.

In order to generate a more uniform profile of electrons toward the anode to obtain a more uniform focal spot, cathodes having an approximately flat emitter surface have been developed. Typically a flat emitter may take the form of a D-shaped filament that is a wound filament having the flat of the "D" facing toward the anode, such as disclosed in U.S. Pat. No. 7,795,792 B2, incorporated herein by reference in its entirety. Such a design emits a more uniform pattern of electrons and emits far fewer electrons from the rounded surface of the filament that is facing away from the anode (that is, facing toward the cup). D-shaped filaments, however, are expensive to produce (they are typically formed about a D-shaped mandrel) and typically require, as well, very tight manufacturing tolerances and separately biased focus electrodes in order to meet focal spot requirements.

Thus, in another example of a flat surface for forming a filament, a flat surface emitter (or a 'flat emitter') may be positioned within the cathode cup with the flat surface positioned orthogonal to the anode, such as that disclosed in U.S. Pat. No. 8,831,178, incorporated herein by reference in its entirety. In the '178 patent a flat emitter with a rectangular emission area is formed with a very thin material having electrodes attached thereto, which can be significantly less costly to manufacture compared to conventionally wound (cylindrical or non-cylindrical) filaments and may have a relaxed placement tolerance when compared to a conventionally wound filament.

In addition, recent developments in diagnostic x-ray tubes made it desirable to provide high emission at reduced tube voltages. For example in vascular x-ray tubes it is desirable to reduce tube voltages to 60 kV from the typical lower limit of 80 kV while ideally maintaining the power delivered to the target. For large focal spots, emission currents between 1000 mA and 1500 mA at 60 kV are desirable. For small focal spots, especially in fluoroscopic mode, emission currents up to 400 mA are desirable. In both cases, the current state of the art, for flat emitters only allows about half the desired emission current.

As larger rectangular emission areas are required to enable higher emission it becomes more challenging to focus the electron beam into a small spot. Further, as shown in FIG. 1, with the dots indicating electron trajectories intersecting the target plane and the stitched lines indicating iso-density contours of the focal spot, the focal spot resulting from the rectangular flat emitter has a shape with some significant aberrations from an ideally straight intensity distribution. The distortion results in the four corners of the focal spot stretched away from the focal spot center thus increasing the effective size of the focal spots, especially in width direction.

To address these focal, spot issues, electrodes are often utilized to direct the electrons from the emitter towards are more defined focal spot. As shown in FIGS. 2 and 3, small and large emitters are surrounded by width and length electrodes that are typically positioned on the cathode cup a few millimeters above the plane of the emitter. The focusing fields provided by the electrodes can direct electrons from the emitter into a more defined focal spot when the electrons are emitted, within a region that the electron can be effected by the focus pads. In FIGS. 2 and 3, electrons corning, from the emitter within the area bounded by the dotted line are directed by the electrodes to a defined focal point. However, in the case of the small emitter in FIG. 2, while the entire emitter is contained within the dotted line thereby achieving a narrow focal spot, a significant area that could be used to emit electrons from the emitter is not utilized, with a significant reduction in emission current. Further, in the case of a larger emitter shown in FIG. 3 that provides a greater emission current, the edges of the large emitter are outside of the effects of the electrodes, resulting in a varied focal spot such that only large focal spots can be obtained.

Accordingly, it is desirable to provide an emitter-cup x-ray tube cathode which overcomes the hereinabove described disadvantages. The importance of improved emission capabilities combined with the ability to focus higher beam currents into smaller and variably sized focal spots is clearly driven by the need to improve the image quality of the medical imaging system using current thermionic emission technology.

BRIEF DESCRIPTION OF THE INVENTION

In the present invention, for maximum emission a cathode is formed with a large area flat emitter. To reduce the aberrations to a minimum the emission area in the flat emitter has a non-rectangular shape. In an exemplary embodiment, the flat emitter has a non-rectangular polygonal shape for an emission area on the emitter in order to increase the emission current from the emitter at standard voltage levels without the need to run the emitters at a higher temperature, add additional emitters to the cathode and/or to coat the emitters with a low workfunction material. This configuration for the emission area of the emitter increases the emission current without adding to the construction of the emitter or reducing the useful lifetime of the emitter, and inhibits the emission of electrons from the edges or triangular shaped corner surfaces of the flat emitter.

In the cathode, the flat emitter is disposed on or within a cathode cup. The cup includes a number of focus electrodes thereon that assist in directing the emission of electrons towards the desired focal point. This cup assembly further allows the cathode to reduce aberrations to a minimum so that focal spots from large to small can be obtained One exemplary embodiment of the invention is an x-ray imaging system comprising a detector positioned to receive x-rays, an x-ray tube configured to generate x-rays toward the detector from a focal spot surface, the x-ray tube comprising a target having the focal spot surface; and a cathode comprising a cathode cup and a flat emitter attached to cathode cup that can emit electrons toward the focal spot surface upon application of a voltage between the emitter and the target, the emitter having a non-rectangular emission area thereon.

Another exemplary embodiment of the invention is a method of manufacturing a cathode assembly for an x-ray tube comprising the steps of providing an emitter having a non-rectangular emission area from which electrons emit when an electrical current is passed therethrough, providing a cathode cup, attaching the cathode cup to a cathode support structure of the x-ray tube such that the cathode cup is electrically insulated from the cathode support structure, coupling a current supply and a current return to the cathode cup, and attaching the flat emitter to the cathode cup such that, when a current is provided by the current supply, electrons emit from the non-rectangular emission area of the flat emitter toward a target of the x-ray tube.

Another exemplary embodiment of the invention is a cathode assembly for an x-ray tube comprising a support structure, a cathode cup attached to the support structure and a flat emitter attached to the cathode cup the flat emitter including at least one non-rectangular emission area thereon.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The drawings illustrate the best mode presently contemplated of carrying out the disclosure. In the drawings:

FIG. 1 is a schematic representation of a focal spot generated by a prior art flat emitter with a rectangular emission area thereon.

FIG. 2 is a schematic representation of a prior art cathode cup including a small flat emitter.

FIG. 3 is a schematic representation of a prior art cathode cup including a large flat emitter.

DETAILED DESCRIPTION OF THE DRAWINGS

Figure 4:
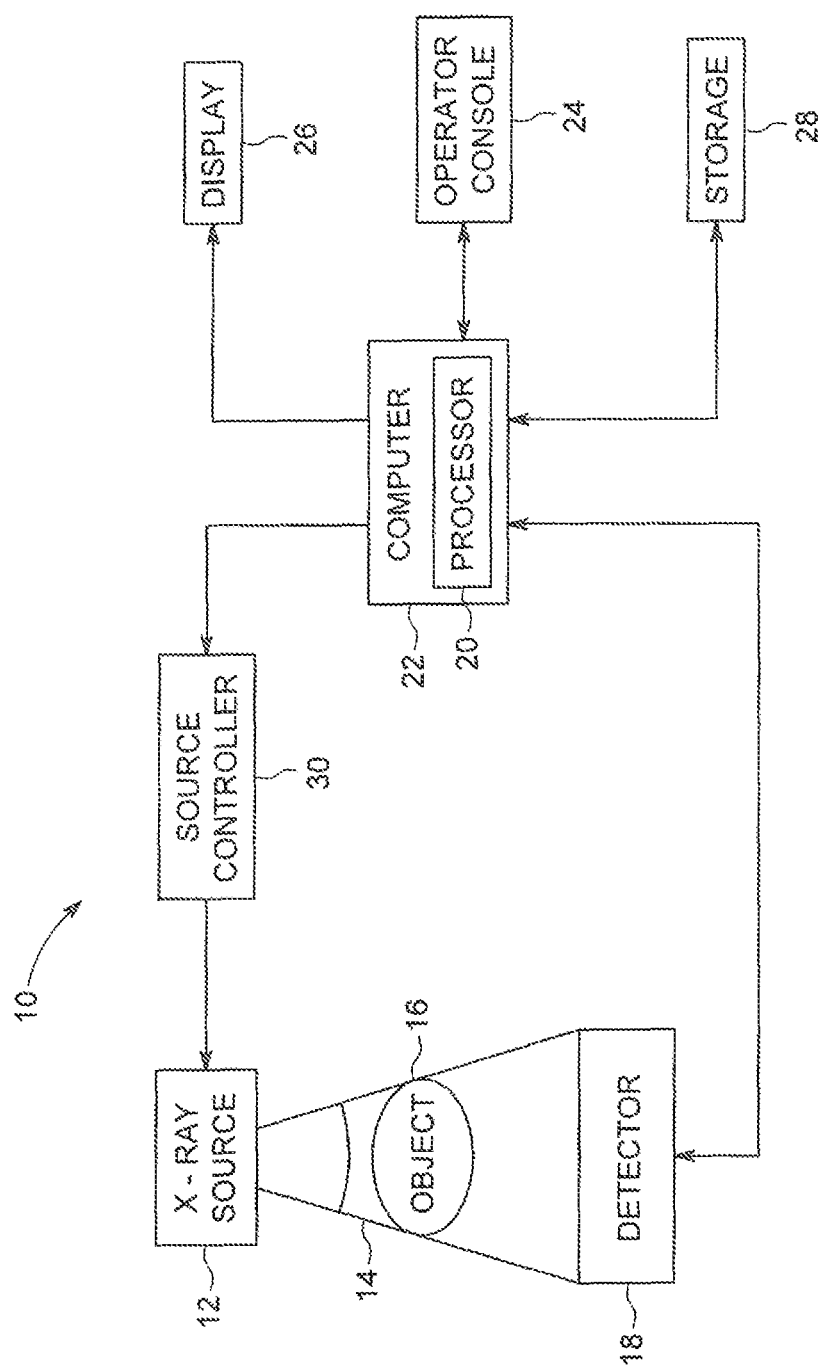
FIG. 4 is a block diagram of an imaging system according to an exemplary embodiment of the invention.

FIG. 4 is a block diagram of an embodiment of an imaging system 10 designed both to acquire original image data and to process the image data for display and/or analysis in accordance with embodiments of the invention. It will be appreciated by those skilled in the art that embodiments of the invention are applicable to numerous medical imaging systems implementing an x-ray tube, such, as x-ray or mammography systems. Other imaging systems such as computed tomography (CT) systems and digital radiography (RAD) systems, which acquire image three dimensional data for a volume, also benefit from embodiments of the invention. The following discussion of x-ray system 10 is merely an example of one such implementation and is not intended to be limiting in terms of modality.

As shown in FIG. 4, x-ray system 10 includes an x-ray source 12 configured to project a beam of x-rays 14 through an object 16. Object 16 may include a human subject, pieces of baggage, or other objects desired to be scanned. X-ray source 12 may be a conventional x-ray tube producing x-rays having a spectrum of energies that range, typically, from 30 keV to 200 keV. The x-rays 14 pass through object 16 and, after being attenuated by the object, impinge upon a detector 18. Each detector in detector 18 produces an analog electrical signal that represents the intensity of an impinging x-ray beam, and hence the attenuated beam, as it passes through the object 16. In one embodiment, detector 18 is a scintillation based detector, however, it is also envisioned that direct-conversion type detectors (e.g., CZT detectors, etc.) may also be implemented.

A processor 20 receives the signals from the detector 18 and generates an image corresponding to the object 16 being scanned. A computer 22 communicates with processor 20 to enable an operator, using operator console 24, to control the scanning parameters and to view the generated image. That is, operator console 24 includes some form of operator interface, such as a keyboard, mouse, voice activated controller, or any other suitable input apparatus that allows an operator to control the x-ray system 10 and view the reconstructed image or other data from computer 22 on a display unit 26. Additionally, console 24 allows an operator to store the generated image in a storage device 28 which may include hard drives, flash memory, compact discs, etc. The operator may also use console 24 to provide commands and instructions to computer 22 for controlling a source controller 30 that provides power and timing signals to x-ray source 12.

Figure 5:
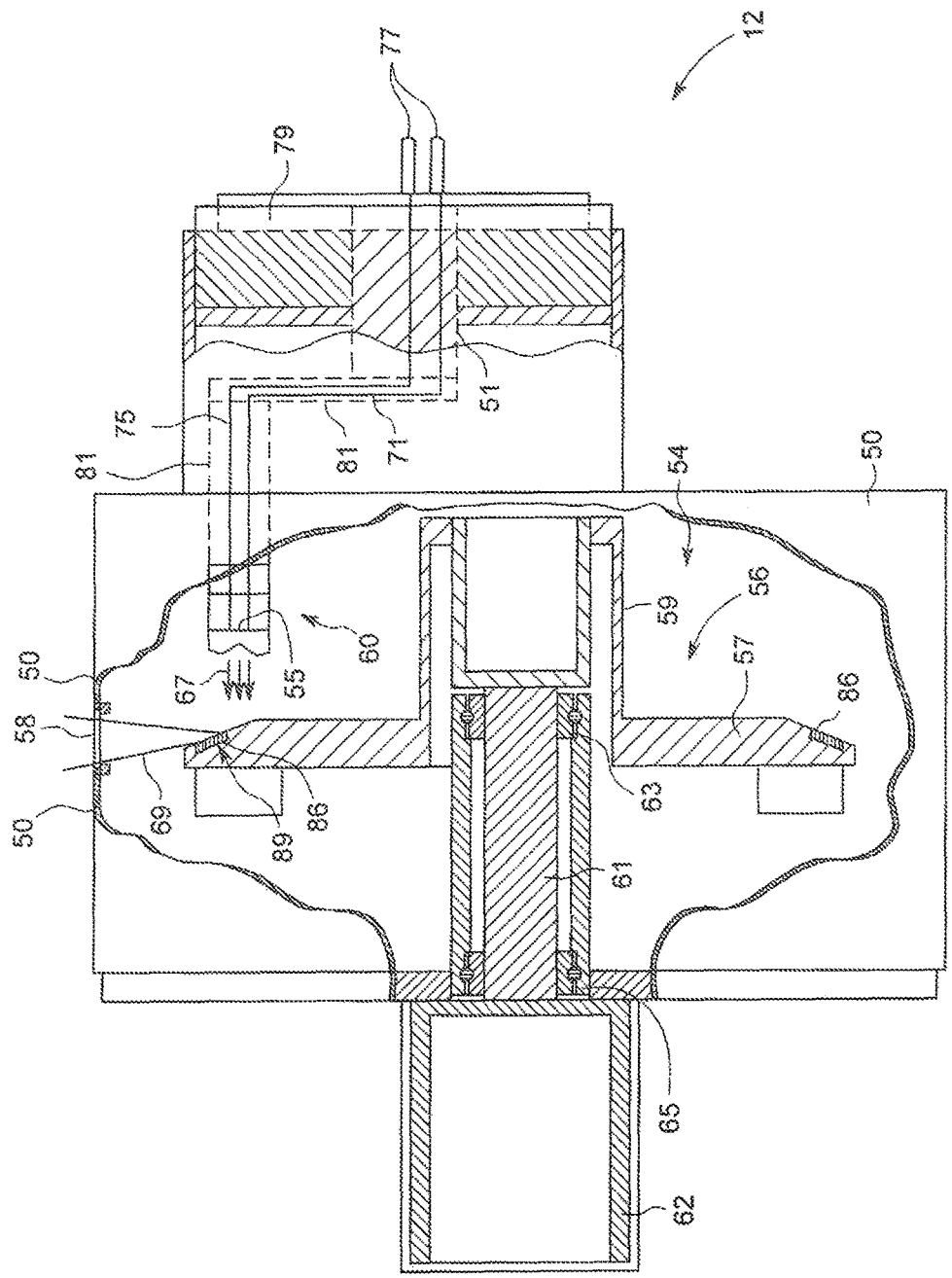
FIG. 5 is a cross-sectional view of an x-ray tube that according to an exemplary embodiment of the invention.

FIG. 5 illustrates a cross-sectional view of an x-ray tube 12 incorporating embodiments of the invention. X-ray tube 12 includes a frame 50 that encloses a vacuum region 54, and an anode 56 and a cathode assembly 60 are positioned therein. Anode 56 includes a target 57 having a target track 86, and a target hub 59 attached thereto. Terms "anode" and "target" are to be distinguished from one another, where target typically includes a location, such as a focal spot, wherein electrons impact a refractory metal with high energy in order to generate x-rays, and the term anode typically refers to an aspect of an electrical circuit which may cause acceleration of electrons theretoward. Anode 56 is attached to a shaft 61 supported by a front bearing 63 and a rear bearing 65. Shaft 61 is attached to a rotor 62. Cathode assembly 60 includes a cathode cup 200 and a flat emitter or filament 55 formed of any suitable emissive material and coupled to a current supply lead 71 and a current return 75 that each pass through a center post 51. In operation, electrical current is carried to flat emitter 55 via the current supply lead 71 and from flat emitter 55 via the current return 75 which are electrically connected to source controller 30 and controlled by computer 22 of system 10 in FIG. 2.

Feedthroughs 77 pass through an insulator 79 and are electrically connected to electrical leads 71 and 75. X-ray tube 12 includes a window 58 typically made of a low atomic number metal, such as beryllium, to allow passage of x-rays therethrough with minimum attenuation. Cathode assembly 60 includes a support arm 81 that supports cathode cup 200, flat emitter 55, as well as other components thereof. Support arm 81 also provides a passage for leads 71 and 75. Cathode assembly 60 includes focus pads 85 that are either attached to cathode cup 200 or machined into cathode cup 200. Width and length electrodes (not shown) are arranged around the emitter 55 on the cup 200, such as on the focus pads 85, and can be electrically isolated and operated to provide a focusing field around the emitter 55 to focus the beams of electrons 67 from the emitter 55 in a range from small to large focal spots.

In operation, target 56 is spun via a stator (not shown) external to rotor 62. An electric current is applied to flat emitter 55 via feedthroughs 77 to heat emitter 55 and emit electrons 67 therefrom. A high-voltage electric potential is applied between anode 56 and cathode 60, and the difference therebetween accelerates the emitted electrons 67 from cathode 60 to anode 56. Electrons 67 impinge target 57 at target track 86 and x-rays 69 emit therefrom at a focal spot 89 and pass through window 58.

Figure 6:
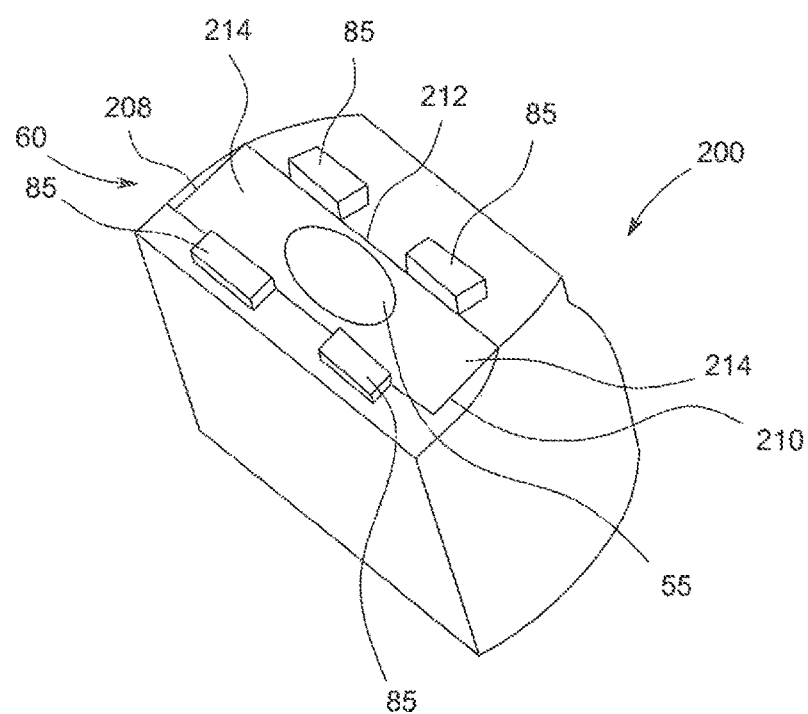
FIG. 6 is a perspective view of a cathode assembly according to an exemplary embodiment of the invention.

Referring now to FIG. 6, the cathode assembly 60 constructed according to one exemplary embodiment of the present invention is illustrated therein. Cathode assembly 60 includes cathode cup 200 formed from a suitable material in a suitable process and connected to cathode support arm 81 and having an insulating material (not shown) positioned to insulate cathode cup 200 from cathode support arm 81. One or more width and/or length electrodes 300 (FIG. 9) are also not shown for clarity of FIG. 6. Flat emitter 55 is positioned on and is electrically coupled to the cup 200 at respective first and second attachment surfaces 208, 210 on the cup 200 which are electrically insulated from each other (not shown). Flat emitter 55 can be attached at first and second attachment surfaces 208, 210 using laser brazing or laser welding, as examples.

Figure 7:
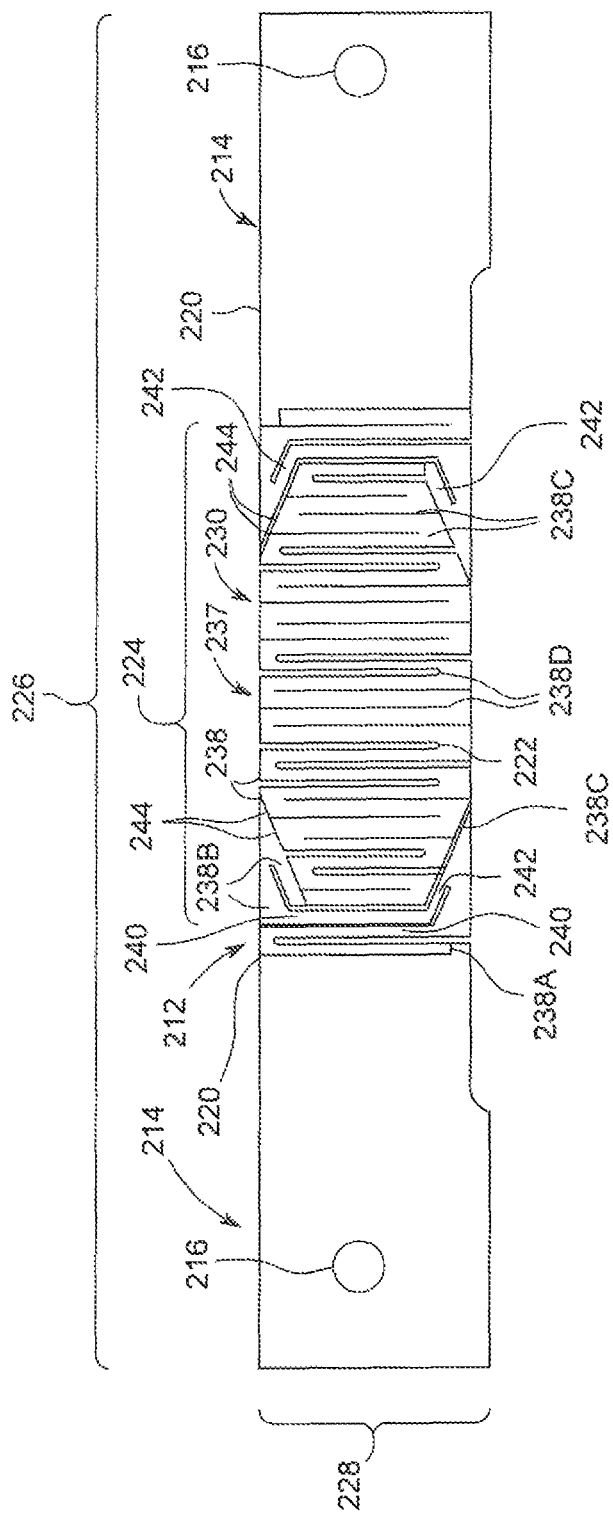
FIG. 7 is a top plan view of a flat emitter according to an exemplary embodiment of the invention used in the cathode assembly of FIG. 6.

In the exemplary embodiment of FIGS. 6 and 7, the flat emitter 55 includes a central emission section 212 disposed between and connected to a pair of non-emitting engagement tabs 214. The tabs 214 can be integrally formed with the central emission, section 212 and each include an aperture 216 formed therein. When the flat emitter 55 is placed on the cup 200 over the attachment surfaces 208, 210, the apertures 216 in the tabs 214 are aligned with bores (not shown) formed in the surfaces 208, 210. Pins (not shown) are inserted through the apertures 216 and into precision-machined bores in cathode cup 200 to fix the flat emitter 55 in position on the cathode cup 200. Each tab 214 may also include one or more outwardly extending flanges 215 that can assist in the proper positioning of the emitter 55 on the cup 200.

According to one exemplary embodiment, the cathode cup 200 includes a number of focus pads 85 that are disposed around the flat emitter 55 when secured to the attachment surfaces 208, 210. The focus pads 85 are positioned or formed on the cup 200 to be adjacent to a part of each edge 220 of the central emission section 212. In this position, when electrons are caused to emit from the central emission section 212 of flat emitter 55, such as electrons 67 illustrated in FIG. 5, according to this embodiment the electrons 67 emitted from the border of the central emission section 212 closest to the focus pads 85 are re-directed by the focus pads 85 towards the target 57.

According to one exemplary embodiment shown in FIG. 7, the flat emitter 55 is a single piece fabricated in such fashion that current passes from one edge 220, along the length of the central emission section 212, to the opposite edge 220. Breaks 222 extend along, a length 224 of the central emission section 212 of the flat emitter 55, but in a fashion that leaves flat emitter 55 as a single piece. Flat emitter 55 includes an overall length 226 and an overall width 228, as shown in FIG. 7, and length 226 is greater than width 228.

The flat emitter 55 includes a cut-out pattern 230 in the central section 212 that includes a generally ribbon-shaped or 'back-and-forth' pattern of legs 238 along which current passes when a current is provided thereto. The cutout pattern 230 is bounded by the non-emitting engagement tabs 214 which do not include a cut-out pattern 230. As stated, referring to FIGS. 6 and 7, a current is applied via current supply line 71 to the cup 200 which flows to flat emitter 55 through attachment surface 208 and to associated engagement tab 214, and then along the back-and-forth pattern of cut-out pattern 230 before returning to cup 200 through the opposite engagement tab 214 and associated attachment surface 210, then passing to current return line 75.

Figure 8:
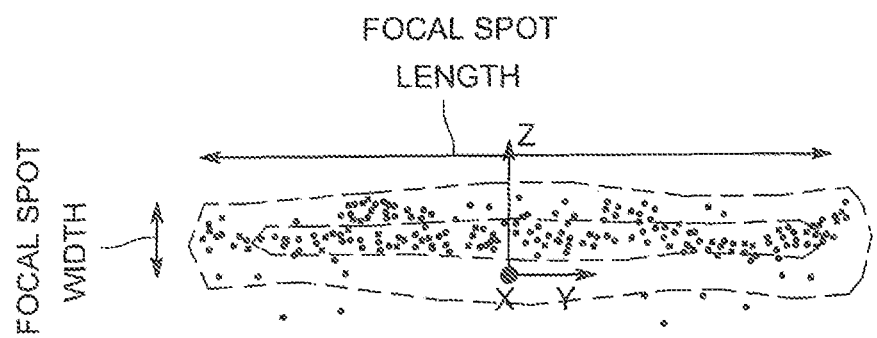
FIG. 8 is a schematic view of a focal spot generated by the flat emitter of FIG. 7.

Pattern 230 includes a number of rungs or legs 238 which traverse back-and-forth across the width 228 of the central emission section 212 of the flat emitter 55 and along which current travels. The legs 238 are formed in the central emission section 212 to provide a non-rectangular polygonal configuration or shape for an emission area 237 of the emission section 212 from which the electrons are emitted when current is passed through the emitter 55. This non-rectangular polygonal emission area 237 can form all or a portion of the emission section 212 and provides maximum emission from the emitter 55, which additionally reduces the aberrations from the emission area 237 to a minimum such that well-defined focal spots from large to concentrated, or small can be obtained, as illustrated in FIG. 8.

Figure 9:
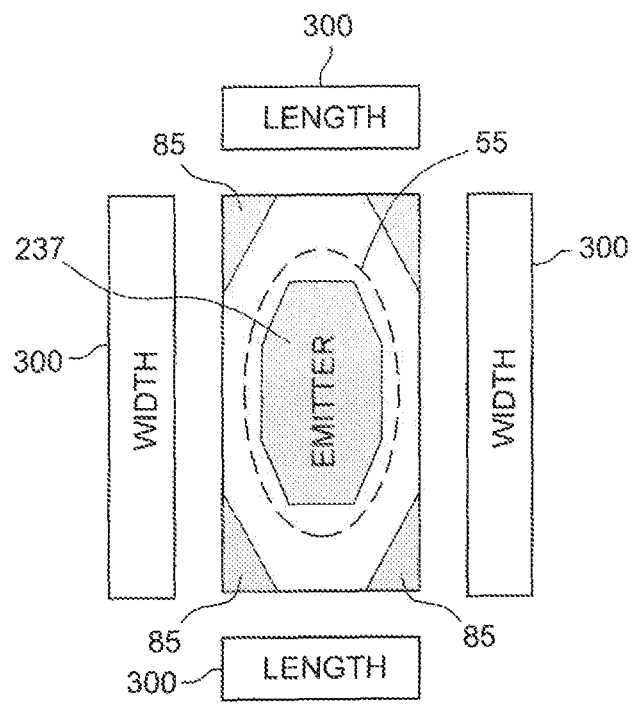
FIG. 9 is a schematic representation of a cathode cup including a flat emitter shaped, according to an exemplary embodiment of the invention.

Focal spots of this configuration are achievable, as a result of the shape of the emitter 55 enabling an interaction of the electrons 67 from the emitter 55 with the focusing field provided by the focus pads 85 in the manner schematically shown in the exemplary embodiment of the invention of FIG. 9. The emitter 55 is contoured in a polygonal manner so that the emissive area remains within a focusing field area where aberrations of the electron beam 67 are small. Additionally, in each of the four corners adjacent to the emitter 55 and slightly above, such as from 0.1-1 mm above, the plane of the emitter 55 in art exemplary embodiment, focusing pads 85 are arranged to further reduce beam aberrations. Due to the improved focusing, focal spot sizes from small, to large focal spots can be obtained by adjusting the heights and/or bias voltages of one or more of the width and length electrodes 300 accordingly. To obtain focal spot sizes relevant for medical imaging, in an exemplary embodiment of the invention, the width of the emitter 55 is typically within 2-6 mm and the length is typically within 6-15 mm. The surfaces of the width and length electrodes 300 are typically positioned on the cathode cup 200 3-8 mm above the surface of the emission area 237 of the emitter 55 such that the width and length electrodes 300, separately from the focus pads 85, can be biased to predetermined positive or negative voltages relative to the emitter to control the size of the focal spot and/or to cut off the electron beam, such as by biasing the width/length electrodes 300 to predetermined negative voltages relative to the emitter to cut off the electron beam.

Further, the non-rectangular polygonal configuration for the emission area 237 enables emission currents from the area 237 at 60 kV of up to 400 mA or more during fluoroscopic applications of the emitter 55 in interventional procedures, and of 1500 mA or more during operation of the emitter 55 in a record mode with large focal spot. In both cases the emission currents provided by the emitter 55 are at least doubled compared to prior art flat emitters having a simple rectangular configuration.

In an exemplary embodiment as shown in FIG. 7, the first legs 238a located adjacent each engagement, tab 214 extend substantially across the width 228 of the central section 212. Legs 238a are connected opposite the engagement tab 214 to a number of second legs 238b, e.g., two legs 238b in the illustrated exemplary embodiment of FIG. 5, that each include a straight portion 240 and an angled portion 242. Opposite the first legs 238a, second legs 238b are connected to a number of third legs 238c that are formed with opposed angled edges 244, which in the exemplary embodiment forms the third legs 238e with a generally trapezoidal shape. The third legs 238c positioned further from the legs 238b have progressively increasing lengths until reaching fourth legs 238d. Fourth legs 238d are rectangular in shape and extend across the entire width of the emitter 55, similar to legs 238a. In this configuration, the shape of the legs 238b and 238c provides the non-rectangular shaping of the outside the central rectangular emission section 238d with a pair of non-rectangular polygonal shapes on either side of a rectangular shape provided by legs 238d, which results in an overall generally octagonal shape for the emission area 237. However, alternative embodiments are contemplated where the emission area 237 is formed with only one non-rectangular shape therein, and/or without any rectangular shapes therein.

Flat emitter 55 typically ranges in thickness from 200 to 500 microns but is not limited thereto. In a preferred embodiment the thickness is 300 microns or less, however one skilled in the art will recognize that the preferred thickness is dependent also upon the widths of legs 238a-d. That is, as known in the art, the electrical resistance within legs 238a-d varies both as a function of a width of each, leg 238a-d and as a thickness of flat emitter 55 (i.e., as a function of its cross-sectional area). According to the invention the width of each leg 238a-d may be the same within all legs or may be changed from leg to leg, depending on emission characteristics and performance requirements.

Flat emitter 55 is positioned within cathode assembly 60 as illustrated in FIG. 6 and as also illustrated in x-ray tube 10 of FIG. 5. Thus when current is provided to flat emitter 55, the current is caused to flow back and forth along legs 238a-d, and the high kV applied between cathode assembly 60 and anode 56 thereby causes electrons 67 to emit from legs 238b-d and toward focal spot 89. As commonly known in the art, the emission pattern of elections 67 is dependent upon a number of factors, which include but are not limited to the width of legs 238a-d, the thickness of the emitter 55, the amount of current supplied, and the magnitude of kV applied between cathode assembly 60 and anode 56. That is, as known in the art the emission is dependent upon the temperature reached by a filament, such as flat filament 55. Thus, when current is input, to emitter 55, although the higher temperatures are reached in the pathways that include legs 238b-d, it is also understood that other portions of flat emitter 55 reach high temperature as well that, in some embodiments, may cause electrons to emit from the other portions as well.

In order to mitigate or reduce electron beam aberrations from outside of the emission area 237 of the central emission section 212, as stated previously, electric fields around the emission area are corrected using focus pads 85 formed or disposed on the cup 200, such that deflection of the electron beam at the outer perimeter of the emission area is minimized when the electron beam is focused into a focal spot by width and/or length electrodes 300. Thus, as illustrated in FIG. 6, flat emitter 55 is positioned on the cup 200 within focus pads 85 having a depth that at least equals or exceeds thickness of flat filament 55. Additionally, a bias voltage may be connected to the focus pads to further minimize the deflection of the electron beam as described above.

In alternative embodiments, the flat emitter 55 can be formed with an area 237 having a configuration different that that illustrated in the exemplary embodiment utilizing the legs 238a-238d, and/or the cup 200 can provide multiple attachment surfaces 208, 210 to enable the filament 55 to be secured at different locations on the cup 200.

The written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that, do not differ from the literal language of the claims, or if they include equivalent structural elements with insubstantial differences from the literal language of the claims.

What is claimed is:

1. An x-ray imaging system comprising:
   a) a detector positioned to receive x-rays;
   b) an x-ray tube configured to generate x-rays toward the detector from a focal spot surface, the x-ray tube comprising:
      1. a target having the focal spot surface; and
      2. a cathode comprising:
         i. a cathode cup; and
         ii. a flat emitter attached to cathode cup that can emit electrons toward the focal spot surface upon application of a voltage between the emitter and the target, the emitter having a non-rectangular emission area with angled edges thereon; and
         iii. a number of focus pads positioned around the non-rectangular emission area,
   wherein the non-rectangular emission area of the flat emitter comprises a cut-out pattern such that a back-and-forth current path is formed in the flat emitter and wherein the cut-out pattern includes a non rectangular emission area and a rectangular emission area.

2. The imaging system of claim 1 wherein the cut-out pattern is octagonal in shape.

3. The imaging system of claim 1 wherein the emission area is joined to a pair of non-emitting engagement tabs.

4. The imaging system of claim 1 wherein the focus pads can be biased to predetermined negative voltages relative to the emitter to reduce the size of the focal spot.

5. The imaging system of claim 1 wherein the cathode cup includes width and length electrodes to focus the electron beam.

6. The imaging system of claim 5 wherein the width and length electrodes can be biased to predetermined positive or negative voltages relative to the emitter to control the size of the focal spot.

7. The imaging system of claim 6 wherein the width and/or length electrodes can be biased to predetermined negative voltages relative to the emitter to cut off the electron beam.

8. The imaging system of claim 1 wherein the non-rectangular emission area includes a number of legs having opposed angled edges.

9. A method of manufacturing a cathode assembly for an x-ray tube comprising the steps of:
   a) providing an emitter having a non-rectangular emission area from which electrons emit when an electrical current is passed therethrough, wherein the non-rectangular emission area of the flat emitter comprises a ribbon-shaped cut-out pattern having back-and-forth legs that extend along the width of the emitter and form the non-rectangular emission area and a rectangular emission area;
   b) providing a cathode cup;
   c) attaching the cathode cup to a cathode support structure of the x-ray tube such that the cathode cup is electrically insulated from the cathode support structure;
   d) coupling a current supply lead and a current return lead to the cathode cup; and
   e) attaching the flat emitter to the cathode cup such that, when a current is provided by the current supply, electrons emit from the non-rectangular emission area and the rectangular emission area of the flat emitter toward a target of the x-ray tube.

10. The method of claim 9 wherein the step of attaching the flat emitter to the cathode cup comprises placing the non-rectangular emission area of the flat emitter adjacent a number of focus pads formed on the cathode cup.

11. The method of claim 9 wherein the legs include opposed angled edges.

12. The method of claim 9 wherein the cathode cup includes a number of width/length electrodes disposed adjacent the non-rectangular emission area, and further comprising the step of adjusting the width/length electrodes to alter a size of a focal spot of the electrons.

13. The method of claim 12 wherein the step of adjusting the width/length electrodes comprises adjusting either the height of the electrodes on the cathode cup or the bias voltage applied to the electrodes.

14. A cathode assembly for an x-ray tube comprising:
   a) a support structure;
   b) a cathode cup attached to the support structure; and
   c) a flat emitter attached to the cathode cup the flat emitter including at least one non-rectangular emission area thereon, and
   d) a number of focus pads positioned around the non-rectangular emission area, wherein the at least one non-rectangular emission area is formed of non-rectangular legs located within but not extending completely across a rectangular emission area.

15. The cathode assembly of claim 14 wherein the at least one non-rectangular emission area comprises a cut-out pattern such that a back-and-forth current path is formed in the flat emitter.

16. The cathode assembly of claim 15 wherein the cut-out pattern includes back-and-forth legs that extend along the width of the emitter.

17. The cathode assembly of claim 16 wherein the cut-out pattern includes back-and-forth legs with opposed angled edges that are spaced from the width of the emitter.

18. The cathode assembly of claim 17 wherein the cut-out pattern is octagonal shape.

19. The cathode assembly of claim 14 wherein the non-rectangular legs are parallel to one another.

* * * * *